(12) United States Patent
Stevenson

(10) Patent No.: US 7,978,011 B1
(45) Date of Patent: Jul. 12, 2011

(54) SYSTEMS AND METHODS FOR MITIGATING DISTORTION IN SINGLE-ENDED AMPLIFIERS

(75) Inventor: Jan-Michael Stevenson, Frisco, TX (US)

(73) Assignee: Zoran Corporation, Sunnyvale, CA (US)

( * ) Notice: Subject to any disclaimer, the term of this patent is extended or adjusted under 35 U.S.C. 154(b) by 131 days.

(21) Appl. No.: 12/421,009

(22) Filed: Apr. 9, 2009

(51) Int. Cl.
*H03G 3/12* (2006.01)

(52) U.S. Cl. .................................. 330/283; 330/296

(58) Field of Classification Search .................. 330/149, 330/296, 260, 261, 283
See application file for complete search history.

(56) References Cited

U.S. PATENT DOCUMENTS

| | | | | |
|---|---|---|---|---|
| 7,532,070 B2 * | 5/2009 | Cowley et al. | ................ | 330/283 |
| 7,696,828 B2 * | 4/2010 | Chang | ........................... | 330/283 |
| 2009/0051424 A1 * | 2/2009 | Liu et al. | ....................... | 330/149 |

* cited by examiner

*Primary Examiner* — Khanh V Nguyen
(74) *Attorney, Agent, or Firm* — Fulbright & Jaworski L.L.P.

(57) ABSTRACT

Systems and methods which implement degeneration circuitry in a single-ended amplifier circuit to mitigate distortion associated with one or more amplifier components are disclosed. A degeneration circuit of embodiments adds an impedance to cancel the second-order distortion of an amplifier transistor of a single-ended amplifier circuit. A bias circuit may be provided to minimize bias offset between an amplifier transistor and a corresponding degeneration transistor.

24 Claims, 2 Drawing Sheets

SYSTEMS AND METHODS FOR MITIGATING DISTORTION IN SINGLE-ENDED AMPLIFIERS

TECHNICAL FIELD

The invention relates generally to amplifier circuits and, more particularly, to addressing distortion with respect to single-ended amplifiers.

BACKGROUND OF THE INVENTION

Various forms of amplifier circuits have been used for years to provide an electrical output that is a function of a corresponding input parameter. Amplifier circuits increase the magnitude of the input by means of energy drawn from an external source, thus introducing gain. It is typically desirable for an amplifier to provide a linear response, meaning that the output signal of the amplifier closely resembles the input signal although the magnitude may be increased.

Amplifier circuits typically employ transistors and/or other active circuit components to introduce gain. Unfortunately, such circuit components are generally non-linear and, therefore, the output signal of an amplifier is not an exact replica of the input signal (at least over a relatively broad range of inputs). There are generally spurious components added to an amplified signal by the amplifier circuitry, such as in the form of harmonic generation or intermodulation distortion (IMD). These nonlinearities result in amplifier transfer functions that do not represent the ideal linear (straight line) amplifier transfer function.

One technique that has been used to address such nonlinearities has been to adopt a differential amplifier circuit configuration. In a differential amplifier circuit configuration, the amplifier circuit is constructed using a differential component configuration that multiplies the difference between two inputs (e.g., $V^+_{IN}$ and $V^-_{IN}$) by a constant factor (the differential gain). The differential component configuration structure operates to cancel out second order nonlinearities associated with the individual components.

The foregoing differential amplifier circuit configuration, although generally providing acceptable linearity, is nevertheless unsuitable for use in many situations. In particular, the differential amplifier circuit configuration, by definition, requires two inputs (doubled-ended input). Moreover, to realize the advantages of the differential component configuration structure to provide canceling of nonlinearities associated with the individual components, the input signals must be balanced. However, many situations requiring signal amplification do not provide, nor readily accommodate, two input signals or double-ended input.

For example, television and broadband cable transmission systems almost universally utilize single signal configurations (single-ended). Such cable transmission systems often employ amplifiers, such as in transmission relays, set top converter boxes, signal splitters, etc. These situations are typically associated with single-ended input and single-ended output, thereby suggesting the use of single-ended amplifier circuit configurations. However, it is desirable for amplifiers used in cable transmission systems to exhibit good linearity, particularly in modern systems where a very broad band of frequencies are transmitted.

Single-ended amplifiers, however, are prone to undesirable distortion. For example, although it may be possible to drive down second-order distortion of a single-ended amplifier by substantially increasing the current, such an increase in current generally results in increased noise, decreased headroom, etc. Moreover, the use of such high current is not conducive to use in low power applications, which are common today.

BRIEF SUMMARY OF THE INVENTION

The present invention is directed to systems and methods which implement degeneration circuitry in a single-ended amplifier circuit to mitigate distortion associated with one or more amplifier components. For example, embodiments of the invention utilize degeneration circuitry which matches the second-order distortion that an amplifier transistor introduces. Embodiments of the invention utilize a degeneration circuitry configuration which is adapted to provide a low amplifier input impedance, facilitating low current amplifier operation.

An embodiment of the invention utilizes a degeneration circuit which adds an impedance to cancel the second-order distortion of an amplifier transistor of a single-ended amplifier circuit. For example, a degeneration transistor, having characteristics closely matching that of the amplifier transistor, is provided in an amplifier circuit to introduce an impedance to cancel the second-order distortion of the amplifier circuit transistor. The amplifier transistor and degeneration transistor of embodiments are disposed in the amplifier circuit in such a way as to provide a configuration in which, as the current increases in the amplifier transistor, the current correspondingly decreases in the degeneration transistor.

According to embodiments of the invention, a bias circuit is provided to minimize bias offset between an amplifier transistor and a corresponding degeneration transistor. For example, embodiments of the invention utilize a direct current (DC) amplifier to couple corresponding nodes (e.g., the bases or the gates) of the amplifier transistor and the degeneration transistor and facilitate a same DC bias voltage to each such transistor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 1:
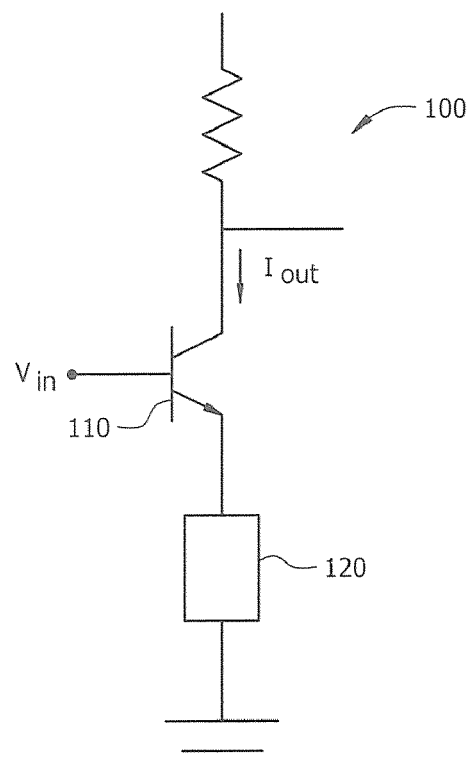
FIG. 1 shows an amplifier circuit adapted according to an embodiment of the present invention.

FIG. 1 shows amplifier circuit 100 adapted according to an embodiment of the present invention. Amplifier circuit 100 comprises a single ended amplifier configuration, wherein a single input signal is used to drive the circuit. Such single ended amplifiers are desirable for use in a number of situations, such as in cable television transmission and reception systems, mobile phones, WiFi data communication systems, radios, etc.

Figure 2:
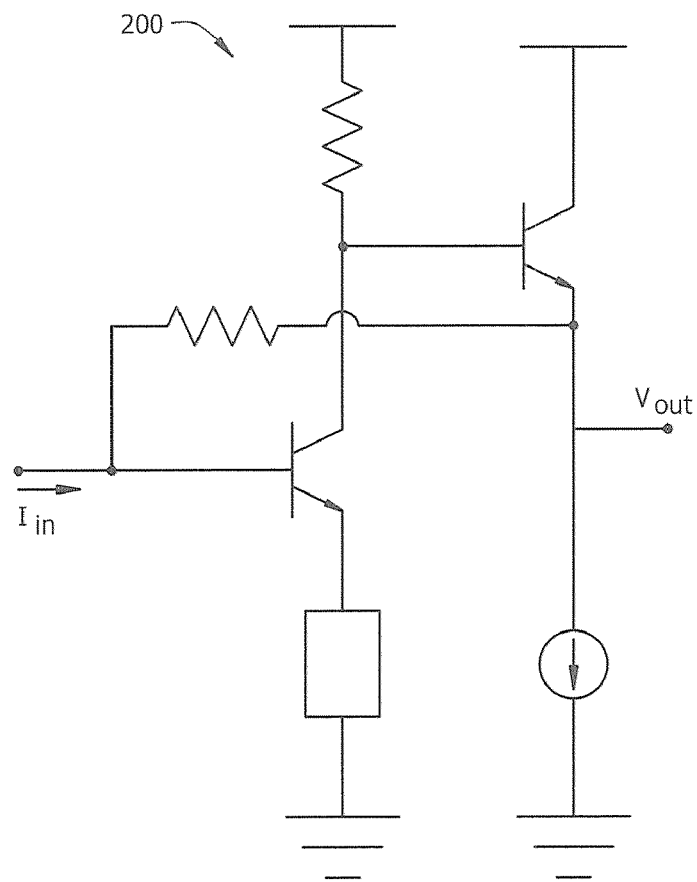
FIG. 2 shows an amplifier circuit adapted according to an alternative embodiment of the present invention.

It should be appreciated that, although amplifier circuit 100 of the illustrated embodiment provides a transadmittance amplifier configuration in which a voltage is input and a current is output, embodiments of the invention may implement different amplifier types and configurations. For example, the concepts of the present invention may be applied with respect to transimpedence amplifier configurations. FIG. 2 shows amplifier circuit 200 providing a transimpedence amplifier configuration adapted according to an embodiment of the invention.

Referring again to FIG. 1, amplifier circuit 100 includes transistor 110 configured to provide an output current, $I_{OUT}$, the magnitude of which is proportionally related to the magnitude of the input voltage, $V_{IN}$, by a gain factor. The gain factor is preferably substantially linear (i.e., linear within a predefined tolerance) over a wide range of inputs. For example, amplifier circuit 100 may be utilized with respect to a cable television transmission system, wherein linear operation over a frequency range of 55 MHz to 1 GHz is desired. However, circuit components such as transistor 110 are generally non-linear. Such nonlinearities, when unchecked, result in a non-linear amplifier transfer function.

Accordingly, amplifier circuit 100 includes degeneration circuit 120 in accordance with the concepts of the present invention. Degeneration circuit 120 adds an impedance to cancel the second-order distortion of transistor 110 according to an embodiment of the invention. For example, degeneration circuit 120 of embodiments comprises a degeneration transistor, having characteristics closely matching that of transistor 110, to introduce an impedance to cancel distortion (e.g., second-order distortion) associated with transistor 110. Such a degeneration transistor is preferably disposed in amplifier circuit 100 in such a way as to provide a configuration in which, as the current increases in transistor 110, the current correspondingly decreases in the degeneration transistor.

The non-linear characteristics of transistor 110 and the non-linear characteristics of a degeneration transistor of degeneration circuit 120 are preferably aggregated such that the aforementioned current correspondence between transistor 110 and the degeneration transistor cause cancellation of distortion. That is, as transistor 110 is operated in a more linear region, the degeneration transistor is operated in a less linear region and, correspondingly, as transistor 110 is operated in a less linear region, the degeneration transistor is operated in a more linear region. This non-linearity aggregation results in amplifier circuit 100 having a linear transfer function over a wide range of inputs.

In order to facilitate the foregoing current correspondence between transistor 110 and a degeneration transistor of degeneration circuit 120, and thus provide cancellation of distortion, embodiments of degeneration circuit 120 comprise a bias circuit to minimize bias offset between transistor 110 and a corresponding degeneration transistor. For example, embodiments of degeneration circuit 120 utilize a DC amplifier to couple corresponding nodes (e.g., the bases or the gates) of transistor 110 and a degeneration transistor of degeneration circuit 120 and facilitate a same DC bias voltage to each such transistor.

Figure 3:
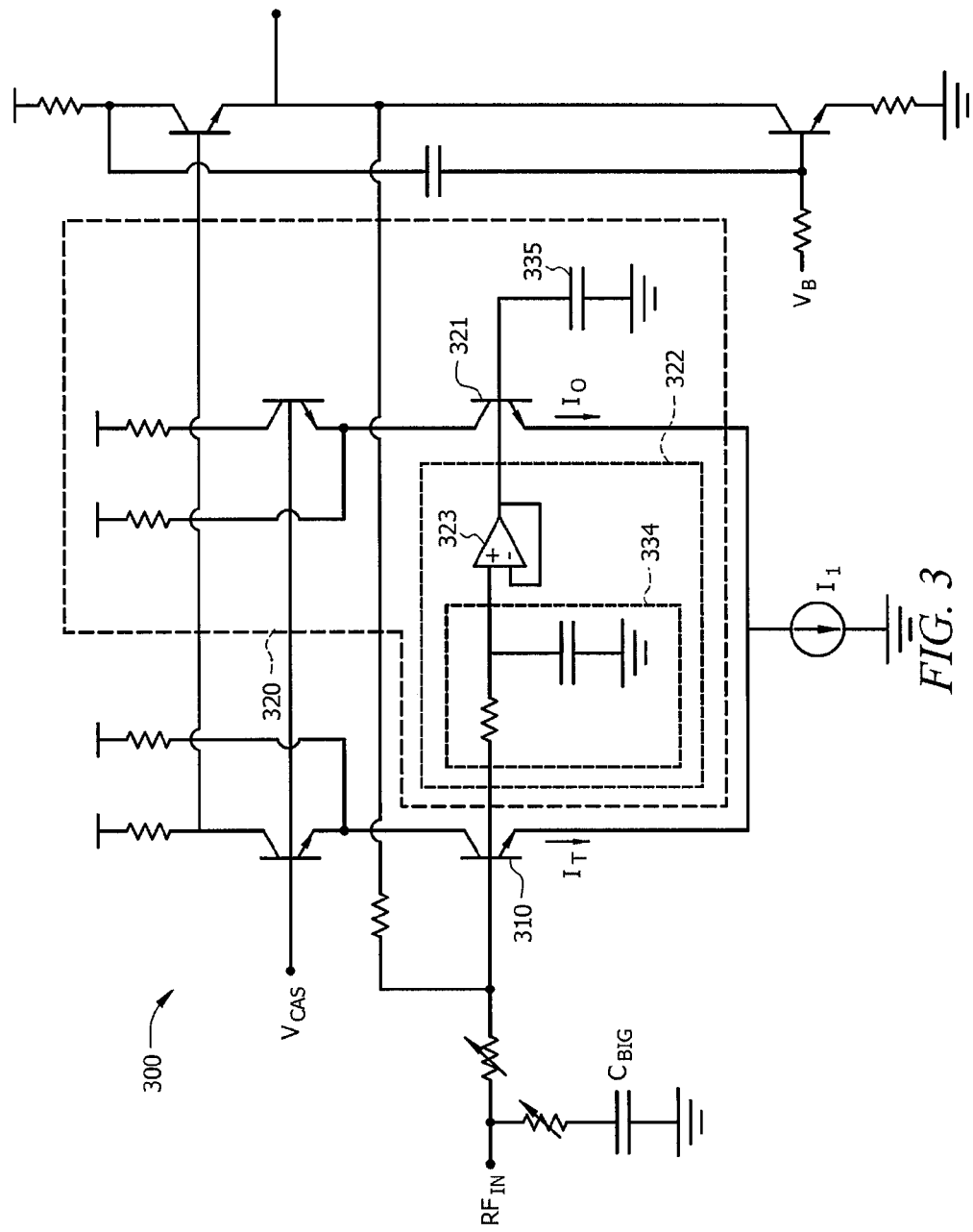
FIG. 3 shows detail with respect to an amplifier circuit adapted according to an embodiment of the invention.

Referring now to FIG. 3, detail with respect to degeneration circuitry implemented in accordance with the concepts of the present invention is shown in a transimpedance amplifier configuration. Specifically, FIG. 3 shows amplifier circuit 300 adapted according to an embodiment of the present invention. As with amplifier circuit 100 discussed above, amplifier circuit 300 comprises a single ended amplifier configuration, wherein a single input signal is used to drive the circuit.

Amplifier circuit 300 includes transistor 310 configured to provide signal amplification. In accordance with the concepts of the present invention, the illustrated embodiment of amplifier circuit 300 includes degeneration circuit 320 adapted to provide substantially linear operation of amplifier circuit 300 over a wide range of inputs.

As with degeneration circuit 120 discussed above, degeneration circuit 320 adds an impedance to cancel distortion (e.g., second-order distortion) associated with transistor 310 according to an embodiment of the invention. Accordingly, degeneration circuit 320 of embodiments comprises degeneration transistor 321, having characteristics closely matching that of transistor 310, to introduce an impedance to cancel the second-order distortion of transistor 310. For example, degeneration transistor 321 of embodiments comprises a transistor that matches the characteristics of transistor 310 as closely as possible, such as by having been made using the same physical characteristics, using the same process, etc.

As can be seen in FIG. 3, degeneration transistor 321 is disposed in amplifier circuit 300 such that current $I_1$ is the aggregate of current $I_T$ (the current associated with transistor 310) and current $I_D$ (the current associated with degeneration transistor 321). Accordingly, as the current increases in transistor 310, the current correspondingly decreases in degeneration transistor 321.

In order to facilitate the foregoing current correspondence between transistor 310 and degeneration transistor 321, and thus provide cancellation of distortion, degeneration circuit 320 of the illustrated embodiment comprises bias circuit 322 to minimize bias offset between transistor 310 and degeneration transistor 321. Specifically, bias circuit 322 of degeneration circuit 320 comprises DC amplifier 323 coupling corresponding nodes (here, the bases) of transistor 310 and degeneration transistor 321. DC amplifier 323 preferably comprises a unity gain amplifier to thereby provide the same DC bias voltage present at transistor 310 to degeneration transistor 321. Embodiments of DC amplifier 323 comprise an operational amplifier (op-amp) disposed in a negative feedback configuration to provide the aforementioned unity gain. Alternative embodiments may utilize bias circuit configurations other than that shown in FIG. 3, wherein such bias circuit configurations assure that the base voltage of transistor 310 equals the base voltage of transistor 321.

In order to ensure that the bias voltage provided to degeneration transistor 321 does not move with a radio frequency (RF) signal input to amplifier circuit 300 ($RF_{IN}$), the bias voltage input to degeneration transistor 321 is preferably RF filtered. Accordingly, bias circuit 322 of the illustrated embodiment comprises RF filter 334, shown in the illustrated embodiment as a resister/capacitor (RC) filter circuit). The RC filter frequency of RF filter 334 is preferably low enough to attenuate the RF input level by a large amount (e.g., $$\frac{1}{2\pi\ RC} \ll f_{RF})$$

according to embodiments of the invention.

In operation of the illustrated embodiment, when the voltage of transistor 310 increases as a function of $RF_{IN}$, more current is pulled though transistor 310 as the amplifier circuit operates to remain in equilibrium because degeneration transistor 321 is isolated from the $RF_{IN}$ signal input, although degeneration transistor 321 is tied to the same DC bias as transistor 310. As more current is pulled through transistor 310, correspondingly less current is pulled through degeneration transistor 321 ($I_T+I_D=I_1$). The non-linear attributes of transistor 310 and degeneration transistor 321 thus aggregate to provide a linear transfer function with respect to amplifier circuit 300 over a wide range of inputs. In particular, because the characteristics of transistor 310 and degeneration transistor 321 are closely matched and these transistors are provided a bias with substantially no offset, the second order distortion associated with each of these transistors effectively cancels each other out.

It should be appreciated that the illustrated embodiment of degeneration circuit 320 includes capacitor 335 coupled from the base of degeneration transistor 321 to ground. Capacitor 335 preferably comprises a relatively large capacitor (e.g., in the range of 100 pF–10 nF), the size of which is dependent upon the RF frequency at which the amplifier is to operate according to embodiments. Capacitor 335 of embodiments is utilized to minimize signal noise that may otherwise be present in the bias voltage applied to the base of degeneration transistor 321.

Additionally or alternatively, capacitor 335 may be utilized to provide a very low impedance at the base of degeneration transistor 321. It should be appreciated that the illustrated embodiment further implements an op-amp as DC amplifier 323 and that such op-amps typically have a low output impedance associated therewith. This low base impedance configuration of degeneration transistor 321 mitigates the effects of any beta mismatch between transistor 310 and degeneration transistor 321 according to embodiments of the invention. Such a beta mismatch, if not mitigated, can lead to a large offset voltage at the inputs of transistor 310 and degeneration transistor 321, which in turn could result failure of the non-linear attributes of transistor 310 and degeneration transistor 321 to aggregate to provide a linear transfer function with respect to amplifier circuit 300. However, DC amplifier 323 of the illustrated embodiment providing the same DC bias voltage to the base of degeneration transistor 321 as is provided to the base of transistor 310 through low impedance mitigates the effects of current mismatch resulting from beta mismatch between transistor 310 and degeneration transistor 321.

From the above described embodiments, it should be appreciated that the concepts of the present invention may be applied to provide a single-ended input to single-ended output amplifier configuration accommodating broadband signals (e.g., 50 MHz to 1 GHz) with good distortion performance and good noise performance. Moreover, such amplifier configurations do not implement increased currents to compensate for second-order distortion, thereby providing efficient power utilization and better noise and compression behavior (headroom).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system comprising:
    an active amplifier component configured to provide amplification with respect to an attribute of a signal; and
    a degeneration circuit coupled to the amplifier component and having a degeneration component with characteristics matching characteristics of the amplifier component and operable to provide cancellation of distortion associated with the amplifier component, wherein the degeneration component is disposed in a circuit configuration to experience increased current flow in proportion to a decrease in current flow experienced by the amplifier component and to experience decreased current flow in proportion to an increase in current flow experienced by the amplifier component.

2. The system of claim 1, wherein the degeneration circuit comprises:
    a bias circuit coupling a node of the amplifier component to a corresponding node of the degeneration component and providing a bias voltage to the node of the degeneration component equal to a bias voltage of the node of the amplifier component.

3. The system of claim 2, wherein the bias circuit comprises:
    a unity gain amplifier.

4. The system of claim 2, wherein the bias circuit comprises:
    an operational amplifier.

5. The system of claim 2, wherein the bias circuit comprises:
    a radio frequency (RF) filter; and
    a direct current (DC) amplifier.

6. The system of claim 2, wherein the amplifier component comprises a transistor and the degeneration component comprises a transistor matching the amplifier component transistor.

7. The system of claim 6, wherein the node of the amplifier component comprises a base of the amplifier component transistor and the corresponding node of the degeneration component comprise a base of the degeneration component transistor.

8. The system of claim 2, wherein the degeneration circuit further comprises:
    at least one component disposed to provide the degeneration component in a low impedance circuit configuration with respect to the bias voltage.

9. The system of claim 8, wherein the at least one component comprises:
a capacitor.

10. A single-ended input, single-ended output amplifier circuit comprising:
an amplifier transistor;
a degeneration transistor coupled to the amplifier transistor, the degeneration transistor having characteristics matching characteristics of the amplifier transistor and disposed in a circuit configuration to provide cancellation of distortion associated with the amplifier transistor; and
a bias circuit coupling a node of the amplifier transistor to a corresponding node of the degeneration transistor and providing a bias voltage to the node of the degeneration transistor equal to a bias voltage of the node of the amplifier transistor.

11. The amplifier circuit of claim 10, wherein the circuit configuration of the degeneration transistor provides increased current flow in the degeneration transistor in proportion to a decrease in current flow in the amplifier transistor and decreased current flow in the degeneration transistor in proportion to an increase in current flow in the amplifier transistor.

12. The amplifier circuit of claim 10, wherein the bias circuit comprises:
a unity gain amplifier.

13. The amplifier circuit of claim 10, wherein the bias circuit comprises:
an operational amplifier in a negative feedback configuration.

14. The amplifier circuit of claim 10, wherein the bias circuit comprises:
a radio frequency (RF) filter; and
a direct current (DC) amplifier.

15. The amplifier circuit of claim 10, wherein the node of the amplifier transistor and the corresponding node of the degeneration transistor each comprises a transistor base.

16. The amplifier circuit of claim 10, further comprising:
at least one component disposed to provide the degeneration transistor in a low impedance circuit configuration with respect to the bias voltage.

17. The amplifier circuit of claim 16, wherein the at least one component comprises:
a capacitor.

18. A method comprising:
providing a single-ended input, single-ended output amplifier circuit having an amplifier transistor and a degeneration transistor; and
operating the amplifier circuit to provide increased current flow in the degeneration transistor in proportion to a decrease in current flow in the amplifier transistor and decreased current flow in the degeneration transistor in proportion to an increase in current flow in the amplifier transistor to thereby provide cancellation of distortion associated with the amplifier transistor.

19. The method of claim 18, wherein the operating the amplifier circuit comprises:
biasing the degeneration transistor with a bias voltage of the amplifier transistor.

20. The method of claim 19, wherein the biasing the degeneration transistor comprises:
coupling a node of the amplifier transistor to a corresponding node of the degeneration transistor using a biasing circuit.

21. The method of claim 20, wherein the biasing circuit comprises a unity gain amplifier.

22. The method of claim 21, wherein the biasing circuit comprises a radio frequency (RF) filter.

23. The method of claim 20, wherein the node of the amplifier transistor and the corresponding node of the degeneration transistor each comprise a transistor base node.

24. The method of claim 20, further comprising:
providing the corresponding node of the degeneration transistor in a low impedance configuration.

* * * * *